United States Patent
Dong et al.

(10) Patent No.: US 8,579,182 B2
(45) Date of Patent: Nov. 12, 2013

(54) METHOD FOR PROVIDING AN INERTING GAS DURING SOLDERING

(75) Inventors: Chun Christine Dong, Macungie, PA (US); Victor Wang, Guangzhou (CN); Jerry Wu, Shanghai (CN); Ranajit Ghosh, Macungie, PA (US); Gregory Khosrov Arslanian, Pipersville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/449,470

(22) Filed: Apr. 18, 2012

(65) Prior Publication Data

US 2013/0098974 A1    Apr. 25, 2013

Related U.S. Application Data

(60) Provisional application No. 61/498,188, filed on Jun. 17, 2011.

(51) Int. Cl.
*B23K 35/12* (2006.01)
*B23K 31/02* (2006.01)

(52) U.S. Cl.
USPC .......................................... 228/260; 228/218

(58) Field of Classification Search
USPC .................................... 228/218–220, 260, 37
See application file for complete search history.

(56) References Cited

U.S. PATENT DOCUMENTS

| | | | | |
|---|---|---|---|---|
| 3,705,457 A | * | 12/1972 | Tardoskegyi | 228/219 |
| 4,602,730 A | * | 7/1986 | Murakami et al. | 228/37 |
| 4,995,411 A | * | 2/1991 | Lowell et al. | 134/198 |
| 5,228,614 A | * | 7/1993 | Elliott et al. | 228/37 |
| 5,240,169 A | * | 8/1993 | Gileta | 228/180.1 |
| 5,294,036 A | | 3/1994 | Den Dopper | |
| 5,388,752 A | * | 2/1995 | Kawakatsu | 228/20.1 |
| 5,769,305 A | * | 6/1998 | Takeda et al. | 228/37 |
| 6,116,491 A | | 9/2000 | Katoh | |
| 6,234,380 B1 | * | 5/2001 | Heine | 228/219 |
| 6,273,319 B1 | * | 8/2001 | Ichikawa et al. | 228/102 |

(Continued)

FOREIGN PATENT DOCUMENTS

| | | | |
|---|---|---|---|
| JP | 8-309519 A | 11/1996 | |
| JP | 9-148726 A | 6/1997 | |

(Continued)

*Primary Examiner* — Kiley Stoner
*Assistant Examiner* — Carlos Gamino
(74) *Attorney, Agent, or Firm* — Amy Carr-Trexler

(57) ABSTRACT

Described herein is an apparatus and method for providing an inerting gas during the application of soldering to a work piece. In one aspect, there is provided an enclosure for providing an inerting gas into an atmosphere above a solder reservoir during soldering of a work piece comprising: a tube in fluid communication with an inerting gas source wherein the tube comprises one or more openings for the flow of the inerting gas therethrough, a base wherein the tube resides in therein and comprises an interior volume, a neck comprising an opening and an interior volume in fluid communication with the interior volume of the base, and a cap proximal to the opening wherein the inerting gas source travels through the tube into the interior volume and into the atmosphere through the opening defined by the neck and cap.

13 Claims, 10 Drawing Sheets

(56) References Cited

U.S. PATENT DOCUMENTS

| | | | |
|---|---|---|---|
| 6,398,104 B2 * | 6/2002 | Heine | 228/260 |
| 6,427,902 B2 * | 8/2002 | Leturmy | 228/219 |
| 6,478,215 B2 * | 11/2002 | Zen | 228/260 |
| 8,070,049 B2 | 12/2011 | Mastele et al. | |
| 8,220,699 B2 * | 7/2012 | Dong et al. | 228/219 |
| 2008/0067219 A1 * | 3/2008 | Barengo et al. | 228/219 |
| 2012/0055980 A1 | 3/2012 | Dong et al. | |

FOREIGN PATENT DOCUMENTS

| | | |
|---|---|---|
| JP | 10-013013 A | 1/1998 |
| JP | 2000071066 A2 | 3/2000 |
| JP | 2001-119134 A | 4/2001 |
| JP | 2001119134 A2 | 4/2001 |
| JP | 2003-205386 A | 7/2003 |
| JP | 2003205386 A2 | 7/2003 |
| KR | 20070113144 A | 11/2007 |

\* cited by examiner

METHOD FOR PROVIDING AN INERTING GAS DURING SOLDERING

CROSS-REFERENCE TO RELATED APPLICATIONS

This application claims priority to U.S. provisional patent application Ser. No. 61/498,188, entitled "Apparatus and Method for Providing an Inerting Gas During Soldering," and filed on Jun. 17, 2011, the disclosure of which is incorporated by reference as if set forth in its entirety herein.

BACKGROUND OF THE INVENTION

Described herein are an apparatus and a method for providing an inerting gas during soldering. More specifically, described herein are an apparatus and a method for providing an inerting gas during wave soldering using nitrogen and/or other inerting gas.

Work pieces such as printed wiring boards or circuit boards have increasingly smaller wettable surfaces that need to be solder coated and joined. Typical operations for wave soldering involve a soldering bath through which the printed circuit boards or work pieces to be soldered are transported. A conventional automatic wave soldering apparatus includes a flux application, a preheater, and a solder station that is arranged to process printed circuit boards. The printed circuit boards are transported along a moving track or conveyor with their side edges supported by gripping fingers. Flux may be applied by contacting the board with either a foam or spray of flux. The circuit board is then passed through a pre-heating area in order for the flux to reduce the oxides on the metal surfaces to be soldered. The circuit board is then contacted with single or multiple waves of molten solder in an air or inerting gas atmosphere.

The inerting gas atmosphere typically is nitrogen ($N_2$) and/or other inerting gases and is oftentimes called $N_2$ inerting. Soldering within an inert gas and/or nitrogen atmosphere minimizes the formation of dross or oxides on the surface of the solder. The presence of dross and/or an oxide layer is known to cause skips, bridges, or other defects in solder joints. Proximal to the solder waves—which are produced by the wave soldering apparatus during operation—are porous pipes or tubes which run parallel to the solder wave and are used to transport the inerting gas and/or $N_2$ gas to provide a relatively low oxygen atmosphere, particularly underneath the work piece to be soldered.

For lead-free wave soldering, the value of an inerting gas atmosphere comprising $N_2$ is further increased due to the following reasons. The process temperature using common lead-free solders is significantly higher than that of conventional tin-lead solder due to the increased melting points of commonly used lead-free solders. This increase in process temperature promotes dross formation. Furthermore, the cost of lead-free solder is normally much higher than that of conventional tin-lead solder, and the economy loss associated with solder waste by dross formation is more significant than that of lead-free wave soldering. In addition, the wetting performance of lead-free solder is intrinsically poor compared with that of conventional tin-lead solder. Therefore, the quality of the formed solder joints is more sensitive to the state of oxidation on a lead-free solder surface.

It is well known that inerting in wave soldering can significantly reduce dross formation on the molten solder surface. Reducing dross formation not only saves solder material and lessens maintenance requirements, but also improves solder wetting and ensures the quality of the formed solder joints. To apply an inerting atmosphere in an existing wave soldering machine, one common approach is to insert a cage-like protective housing with diffusers mounted inside into the molten solder reservoir. An inerting gas blanket across the solder reservoir can thus be formed, reducing the tendency of solder oxidation.

The diffusers are commonly made of porous tubes that introduce an inerting gas such as $N_2$ and/or other inerting gases into the soldering station. The porous tubes, however, become easily clogged by solder splashing or flux vapor condensation during the wave soldering process. Once the diffuser tube is clogged, the efficiency of inerting will be largely reduced. Present methods of cleaning the diffuser tubes such as, for example, using ultrasonic baths filled with cleaning solutions, are extremely difficult and time consuming. The cleaning of these tubes must be performed on a regular basis and can cause physical damage to the tubes. To avoid these issues, the diffuser tubes are typically replaced once they become clogged rather than cleaned. This increases the overall cost to the end-user.

Accordingly, in order to promote the application of inerting by $N_2$ and/or other inerting gases in wave soldering, it is desirable that the apparatus, method, or both fulfill at least one or more of the following objectives. First, it is desirable that the inerting apparatus and method reduces $N_2$ or other inerting gas consumption to a level such as, but not limited to, 12 cubic meters per hour ($m^3$/hr) or less for inerting a production-scale solder reservoir to meet the cost benefits of applying the technology. Second, it is desirable that the inerting apparatus and method reduces the concentration of $O_2$ above the molten solder surface to a level such as, but not limited to, 2500 parts per million (ppm) or less, or 2000 ppm or less, which corresponds to the cases in which no circuit board is loaded above the solder pot. Third, it is desirable that the inerting apparatus and method uses an apparatus that is simple to install and maintain to minimize retrofitting cost. Moreover, it is desirable that the apparatus or method reduces or eliminates the clogging of the porous diffuser tube to ensure a stable and long lasting inerting performance.

BRIEF SUMMARY OF THE INVENTION

The apparatus and method described herein fulfills at least one or more of the above objectives for inerting using nitrogen and/or other inerting gases that may be more cost effective and user friendly than comparable methods and apparatuses presently in use.

In embodiments of the present invention, one or more diffuser tubes are contained within an enclosure. In one particular embodiment, the enclosure is bottle-shaped and defines an interior volume. During operation, at least a portion of the enclosure such as, for example, the base and the lower part of the neck, is immersed into a solder reservoir. The enclosure further has a neck which extends to an opening and a cap which is proximal to the opening. The diffuser tube contained within the enclosure such as in the base of the enclosure has a flow of inerting gas therethrough. The inerting gas passes through openings in the diffuser tube and into the interior volume of the enclosure. The inerting gas then passes through the neck and out of the opening where it is directed into the atmosphere above the solder reservoir. In certain embodiments, at least a portion of the enclosure, the neck, the cap, or a combination thereof may be comprised of a non-stick coating or material. In one particular embodiment, the at least one diffuser tube that is enclosed comprises the center diffuser tube or the diffuser tube that resides between solder waves. In an alternative embodiment, three diffuser tubes are employed in a solder reservoir, and all three diffuser tubes are enclosed. In some of these or other embodiments, the material of the enclosure comprises titanium in order to avoid dissolution of the enclosure material by the molten solder.

In some embodiments of the invention, there is provided an enclosure for providing an inerting gas during soldering of a work piece comprising: a base comprising an interior volume in fluid communication with an inerting gas source, a neck comprising an interior volume in fluid communication with the interior volume of the base and an opening, a cap proximal to the opening, and a tube comprising one or more openings for the flow of the inerting gas therethrough, wherein the tube resides within the base and is in fluid communication with the inerting gas source; wherein the inerting gas travels through the tube into the interior volume of the base and neck and out through the opening.

In other embodiments of the invention, there is provided an apparatus for providing an inerting gas during soldering of a work piece, the apparatus comprising: at least one groove on the bottom of the apparatus for placing onto at least one edge of a solder reservoir, wherein the solder reservoir contains molten solder and wherein at least one side wall of the groove and at least one wall of the apparatus define a chamber outside of the solder reservoir; at least one opening on the top surface of the apparatus through which at least one solder wave emitting from the solder reservoir passes and contacts the work piece; and one or more tubes comprising one or more openings in fluid communication with an inerting gas source wherein at least one of the tubes resides within the chamber; wherein the apparatus is positioned above the solder reservoir and underneath the work piece to be soldered thereby forming an atmosphere.

In further embodiments of the invention, there is provided a method for providing an inerting gas atmosphere during wave soldering of a work piece, the method comprising: providing a wave soldering machine comprising: a solder reservoir having molten solder contained therein, at least one nozzle, and at least one pump to generate at least one solder wave from the molten solder bath upwardly through the nozzle; placing an apparatus atop at least one edge of the solder reservoir wherein the apparatus comprises at least one opening on a top surface, at least one groove that rests atop the at least one edge of the solder reservoir, and a plurality of tubes comprising one or more openings in fluid communication with an inerting gas source, wherein the work piece and the top surface of the molten solder define an atmosphere; passing the work piece along a path so that at least a portion of the work piece contacts the at least one solder wave emitting through the opening of the apparatus; and introducing an inerting gas through the one or more tubes into the atmosphere, wherein at least one tube resides in an enclosure; wherein the enclosure comprises a base comprising an interior volume in fluid communication with an inerting gas source, a neck comprising an interior volume and an opening in fluid communication with the base, and a cap proximal to the opening, wherein the tube residing in the enclosure is housed within the base; and wherein the inerting gas travels through the tube into the interior volume of the enclosure and into the atmosphere through the opening defined by the neck and cap.

BRIEF DESCRIPTION OF SEVERAL VIEWS OF THE DRAWINGS

FIG. 2a' provides an exploded, isometric view of an embodiment of a diffuser tube comprising pores or a porous tube described herein comprising an enclosure and a cap and further comprising one or more holes in the neck portion of the enclosure.

FIG. 2b provides an assembled, isometric view of an embodiment of a shown in FIG. 2a.

FIG. 2c provides a side, exploded view of an embodiment shown in FIG. 2a.

FIG. 3b provides an isometric view of the embodiment of the apparatus described herein and shown in FIG. 3a.

FIG. 4b provides a top view of the embodiment of the apparatus described herein and shown in FIG. 4a.

FIG. 5b provides a top view of the embodiment of the apparatus described herein and shown in FIG. 5a.

DETAILED DESCRIPTION OF THE INVENTION

Figure 1:
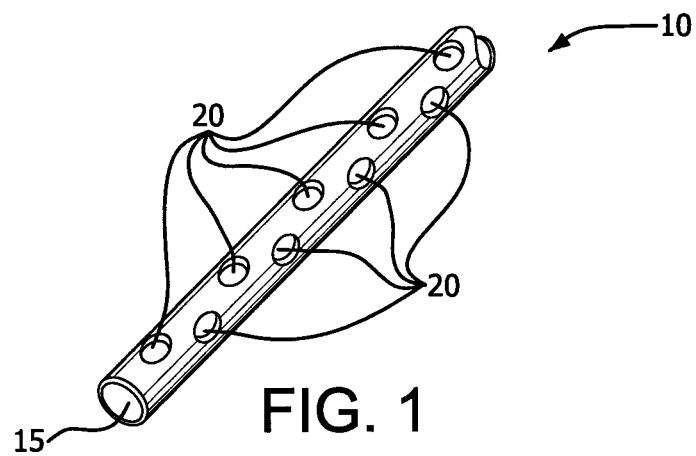
FIG. 1 provides an isometric view of an embodiment of a diffuser tube comprising pores or a porous tube described herein.

At least one or more of the objectives in the art are fulfilled by the method and apparatus described herein for inerting protection during soldering. The apparatus and method described herein provides inerting protection during soldering, particularly for those embodiments where significant movement and swirling of the solder during soldering of work pieces, such as printed circuit boards, and increased oxidation of the surface of the work pieces may occur. It is anticipated that the apparatus and method described herein can be used, for example, to retrofit an existing wave soldering machine. In operation, in certain embodiments herein the apparatus is placed over the solder reservoir and under the moving track or other conveyance mechanism for transporting the work pieces to be soldered. One or more diffuser pipes housed within the apparatus are in fluid connection with an inerting gas source such as nitrogen, another inert gas (e.g., helium, neon, argon, krypton, xenon, and combinations thereof), forming gas (e.g., mixture of nitrogen and hydrogen comprising up to 5% by weight of hydrogen), or combinations thereof to provide an inerting atmosphere. One objective of the apparatus and method described herein is a reduced concentration of oxygen ($O_2$) in the atmosphere defined by the work piece surface to be soldered and the surface of the molten solder contained within the solder reservoir such as, but not limited to, 2500 parts per million (ppm) or less as measured when no circuit board is loaded above the solder reservoir.

The apparatus described herein is intended to be placed atop a solder reservoir containing molten solder that is maintained at or above the solder's melting point (e.g., up to 50° C. higher than the solder's melting point). The apparatus described herein has an internal volume that sets atop of the solder reservoir thereby defining an atmosphere between the work piece to be soldered (which is conveyed in one direction on a moving track above the solder reservoir) and the molten solder surface. In certain embodiments, the work pieces are supported by a moving track or conveyor fingers at side edges of the apparatus and the fingers pass through the solder wave(s). In other embodiments, the work pieces are supported on pallets, fixtures, or frames as they are conveyed through the wave soldering machine. The solder reservoir has one or more nozzles therein that project one or more solder waves that are generated by a solder pump. The solder pump is typically a variable speed pump that allows the end user to control the flow of solder from the solder wave(s) and raise or lower the apex or crest of the solder wave(s) to suit processing conditions. In one or more embodiments herein, a housing or other enclosure may also be placed around the solder pump or a portion of the solder pump and inerting gas may be supplied so as to create an inert atmosphere around at least a portion of the pump, thus minimizing dross formation.

The one or more solder waves contact the surface of the work piece to be soldered through one or more openings in the top surface of the apparatus described herein. During this process, the apparatus additionally comprises one or more diffuser tubes comprising one or more openings, apertures, slots, perforations, or pores that are in fluid communication with an inerting gas source such as $N_2$, such that the inerting gas passes through the interior volume of the tube and out through the opening or pores of the tubes into the atmosphere. In doing so, the under surface, front edge, back edge and side edges of the work piece are uniformly blanketed by the inerting gas as the work piece passes through the solder wave(s).

In certain embodiment of the apparatus and method described herein, the size of the apparatus placed atop the solder reservoir is minimized to intensify the inerting efficiency around the moving solder waves. In this or other embodiments, the static molten solder surface, or area outside of the footprint of the apparatus in the solder reservoir, can be covered by a high temperature material that can withstand the temperature of the molten solder contained within the solder reservoir.

The apparatus and method described herein comprise one or more diffuser tubes comprising an interior volume and one or more openings which can be, but are not limited to, pores, holes, slots, vents, apertures, perforations or other means that allow for the passage of nitrogen and/or other inerting gas within the interior volume of the tube and out through the openings of the tube. In one particular embodiment, the tubes are porous and comprise an average pore size of about 0.2 microns (μm) or less to provide a laminar flow of inerting or $N_2$ gas out of the porous tube. In this or other embodiments, the tubes are in fluid communication with an inerting gas source that supplies the inerting gas such as, for example, $N_2$ through the interior volume of the tube and out through the openings or pores of the tubes into the area defined by the surface of the molten solder in the reservoir and conveyed work pieces.

By enclosing at least one of the porous diffuser tubes, the apparatus described herein satisfies one or more of the needs in the art by preventing the clogging of the openings or pores of the diffuser tubes from solder splashing and flux vapor condensation. In this regard, addressing the problem of clogging of a centrally located diffuser tube is a difficult task because the center diffuser tube typically resides between two solder waves. Oftentimes, the distance between the two waves is approximately the same as that of the diameter of the diffuser, such that there is insufficient space to provide a protective shell with open slots around the center diffuser. One embodiment of present apparatus solves this problem by housing the center diffuser in an enclosure. The enclosure comprises a "bottle neck"-type shape with a cover on top of the neck, wherein the base of the enclosure is at least partially immersed within the molten solder reservoir and the neck part emerges out of the molten solder surface such as in the embodiment shown in FIG. 3c. An inerting gas blanket over the solder waves can be generated from the opening at the top of the enclosure's neck.

In one or more embodiments herein, the neck of the enclosures described herein comprises one or more holes or other openings. The one or more holes are designed to allow solder to pass through the neck of the enclosure, thus improving flow of the solder within the solder reservoir particularly when the enclosure is positioned between two solder waves. The holes may be circular, elliptical, square, rectangular, or any other shape provided that solder is permitted to flow through. Similarly, when more than one hole is employed, the holes may be laid out in any arrangement, for example in a horizontal line along the length of the neck or in a staggered arrangement. The one or more holes may be any size such that the goal of improving solder flow is accomplished and will depend on the overall dimensions of the enclosure. In certain embodiments, the one or more holes in the neck of the enclosure may range from about ¼" to about 1" in diameter, or from about ⅜" to about ⅞" in diameter, or from about ½" to about ¾" in diameter.

In certain embodiments of the invention, a cover is positioned above the neck of the enclosure to form an open space between the neck and the cover and direct the flow of the inerting gas as it exits the opening at the top of the neck. The cover may be separate and detached from the neck, or it may be affixed to the neck at one or more points so as to hold the cover in place. When the cover is separate and detached from the neck, it may be held in place by affixing the cover to another surface, such as to the housing or walls of the apparatus, at one or more points and by any suitable method of attachment. For example, the cover may be attached to the neck, to the walls of the apparatus, or to another surface by one or more screws, pins, clips, by welding, or by another mechanism.

The advantages of the apparatus and method described herein include one or more of the following: 1) the diffuser is enclosed, thereby avoiding the potential clogging of the tube openings by splashing solder; 2) the neck part of the enclosure is narrow and comprised of a thermally conductive material which becomes hot and eliminates the chance for flux vapor condensation and solidification of splashed solder; 3) the neck of the enclosure can, in certain embodiments, be coated with a non-stick coating or material to minimize coating by flux residue when contacting liquid flux; and 4) the neck of the enclosure can be made of a narrower diameter than the base that contains the diffuser tube in order to fit into the narrow space between two solder waves without blocking or interfering with the dynamic movement of the waves. In certain embodiments, lower oxygen readings, such as for example less than 2000 parts per million, can be reached by housing at least one or more diffuser tubes in the enclosure described herein, where the oxygen measurements are conducted with no circuit board loaded above the solder pot.

In one particular embodiment, at least one of the diffuser tubes is housed within the base of a protective enclosure and at least a portion of the enclosure is immersed in molten solder to be kept at high temperature. In this or other embodiments, the portion of the neck of the enclosure closest to the base can also work as heat conductor to keep the upper part of the neck at a high temperature. In the same or other embodiments, either due to pre-heating or to the heat conduction of the base and neck of the enclosure, the inerting gas exiting the enclosure is hot, such as for example from about 160° C. to about 220° C., or from about 170° C. to about 210° C., or from about 180° C. to about 200° C. In some embodiments, the inert gas (such as nitrogen) is supplied to a diffuser tube at ambient temperature and is heated as it travels through the enclosure such that it exits the neck of the enclosure at approximately 180° C. to 200° C. In other embodiments, the gas may be pre-heated. The use of hot inerting gas within the wave soldering apparatus is beneficial for reducing soldering defects, such as incomplete or inconsistent barrel fill. Barrel fill defects are caused by temperature gradients, and hot inerting gas may be employed to minimize temperature gradients across a work piece in the X-Y and Z directions.

In one particular embodiment, the apparatus and method described herein addresses the space limitation between a pair of soldering waves. In this regard, the size of the cross section of the neck and cap can be minimized to a range of from about 5 to about 8 mm. The diameter of the base of the enclosure can range from about 13 to about 20 mm or about 15 mm. It is understood that these dimensions may change depending upon the configuration of the wave soldering apparatus, and can be scaled up or down. Particularly, it may be desirable to vary the height of the neck portion of the enclosure depending upon the dimensions of the soldering equipment used.

In certain embodiments comprising a center diffuser tube and one or more side diffuser tubes, only the center diffuser tube is encased in the enclosure described herein. In alternative embodiments, the center diffuser and one or more of the side diffusers are encased in the enclosure described herein.

As previously mentioned, the apparatus described herein comprises a housing that contains one or more diffuser tubes and an interior volume. In certain embodiments, the tubes may be located between the plurality of solder waves, at the board entrance side of the solder reservoir, at the work piece exit side of the solder reservoir, or combinations thereof. In certain embodiments, one or more of the tubes may further comprise a bottle-shaped enclosure having an interior volume to allow the flow of an inerting gas into the diffuser tube and out into the volume wherein at least a portion of the enclosure contacts or is immersed within the molten solder. The enclosure further comprises a neck having an opening and a cap that allows the inerting gas to flow through the neck out the opening defined by the mouth and cap and into the atmosphere. In certain embodiments, the cross-section of the cap over the opening of the neck of the enclosure has an inverted U, V, or C shape. In other embodiments such as where one or more of the side diffusers are enclosed (see, for example, FIG. 5a), the enclosure does not have a cap because the underside of the apparatus provides direction for the inerting gas into the atmosphere defined by the apparatus and molten solder surface.

In certain embodiments, at least a portion of the enclosure may be a part of the vertical wall of the apparatus such as, for examples, the enclosure for one or more of the side diffuser tubes. The placement of one or more diffuser tubes within an enclosure and into the soldering bath avoids the previous problems associated in the prior art with immersion and/or contacting the porous tube directly with the solder bath because the diffuser tube is housed within the enclosure which prevents molten solder from clogging the openings of the porous tube.

In one particular embodiment of the apparatus and method described herein, at least a portion of the base enclosure, the neck, the cap, or a combination thereof comprises a non-stick coating or material. An example of a non-stick coating is polytetrafluoroethylene (PTFE) coating, which may be found under the trademark Teflon® non-stick coating (Teflon is manufactured by DuPont, Inc. of Wilmington, Del.). In one embodiment of the apparatus described herein, the enclosure comprises a base, a neck, and a cap. In these or other embodiments, the non-stick coating selected should maintain its integrity at or above the temperature of the molten solder commonly used in lead-free wave soldering process (e.g., up to about 260° C.). In a more particular embodiment, the non-stick coating is comprised of Thermolon™ non-stick coating, an inorganic (mineral based) coating which is manufactured by Thermolon Ltd. of South Korea, and which can maintain its integrity at 450° C. and avoids generation of toxic vapor at elevated temperatures.

In one particular embodiment wherein the center diffuser tube resides within a bottle-shaped enclosure having a C-shaped, U-shaped or V-shaped cap and further resides between one or more pairs of soldering waves, the dissolved flux in the solder reservoir can directly contact the neck of the enclosure, the cap, or both located between the $1^{st}$ and the $2^{nd}$ waves due to a continual dynamic movement of the molten solder. When the liquid flux on the enclosure neck and/or cap surface is evaporated or thermally decomposed, solid flux residue may be left behind on the enclosure neck surface and/or cap. A non-stick coating may therefore be applied to the enclosure base, neck, cap, or any combination thereof to reduce the time and expense of routine maintenance of the apparatus. The non-stick coating can also be applied to at least a portion of the internal surface of the apparatus or the internal surface of the top cover, to allow for ease of cleaning.

In yet another embodiment of the apparatus and method described herein, the apparatus further comprises an optional cover mounted on the moving track thereby forming a tunnel for the work pieces to pass therethrough. The optional cover further comprises a ventilation hole that is in fluid communication with the ventilation exhaust of the wave soldering machine that allows for the collection of flux vapor from the atmosphere underneath the cover. In one embodiment, the optional cover is made of a single layer metal cover with a center hole connected to the ventilation exhaust of the machine. In another embodiment, the optional cover is made of double layer metal sheets, and the double layer space is connected to the furnace ventilation exhaust, thus forming a boundary gas trap. In one particular embodiment, the distance between the two layers of metal sheets can range from about ⅛" to about ¼". When a work piece or circuit board is passing underneath the cover, flux vapor generated inside the soldering area can be collected through the boundary trap, while air surrounding the solder reservoir can also be trapped in the double layer space, thereby ensuring good inerting performance. For the case of where there is no work piece or circuit board on top of the solder reservoir, the inerting gas generated from one or more diffusers enclosed as described herein in the inerting apparatus can be sucked into the volume underneath the double layer space of the cover, thereby forming a boundary inerting gas curtain to minimize air from entering into the volume.

FIG. 1 provides one embodiment of the porous tube or diffuser that is used in the apparatus and method described herein. Porous tube 10 is depicted as being a cylindrical tube which has an internal volume 15 that allows for an inerting gas such as nitrogen and/or other gas such as, but not limited to, another inert gas (e.g., argon, helium, neon, etc.), hydrogen, or combinations thereof, to flow therethrough and is in fluid communication with an inerting gas source (not shown). In one embodiment, porous tube 10 is made of stainless steel. However, other materials for porous tube 10 may also be applicable as long as the materials are not reactive to the solder material. Porous tube 10 is in fluid communication with the inerting gas source through a gaseous conduit or other means (not shown). Porous tube 10 further comprises a plurality of perforations, pores, or holes 20 (referred to herein generally as "perforations") that allow for the flow of gas from the internal volume 15 into the soldering bath, the interior volume of the enclosure (not shown), the atmosphere defined by the surface of the molten solder (not shown) and underside of the work piece to be soldered (not shown), or combinations thereof. While porous tube 10 is shown as being cylindrical and having a circular cross-sectional, it is anticipated that other geometries, such as, but not limited to, annular, square, rectangular, elliptical, etc., may be used.

Perforations 20 are designed so that gas flow is narrowly directed, for example, with circular holes as shown in the embodiment of FIG. 1 and distributed over the entire length of the soldering reservoir (not shown). In another embodiment, perforations 20 can be longitudinal holes or slits. In these or other embodiments, perforations 20 may be chamfered or angled to further direct the flow of gas from the internal volume 15 into the soldering bath (not shown) and/or gap between solder bath and work piece. The average pore size for perforations 20 may range from 0.05 micron to 100 micron, or from 0.1 to 10 micron, or from 0.2 to 5.0 micron. In one particular embodiment, the mean pore size of the perforations 20 is about 0.2 microns or less. The size and number of the perforations on porous tube 10 are optimized to pursue a laminar flow of gaseous $N_2$ out of the porous tube. In these or other embodiments, a laminar flow of $N_2$ and/or other inerting gas is preferred for minimizing air intruding from boundaries of the soldering area (e.g., work piece, conveyor belt, etc.) to be inerted.

Figure 2A:
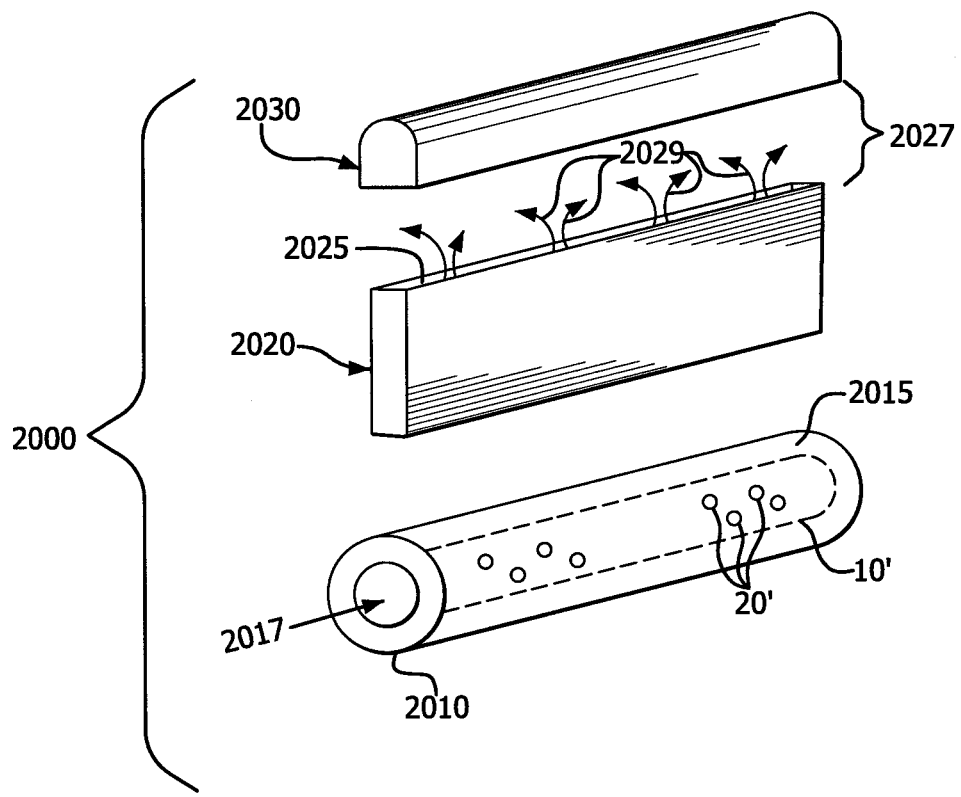
FIG. 2a provides an exploded, isometric view of an embodiment of a diffuser tube comprising pores or a porous tube described herein further comprising an enclosure and a cap.
Figure 2A:
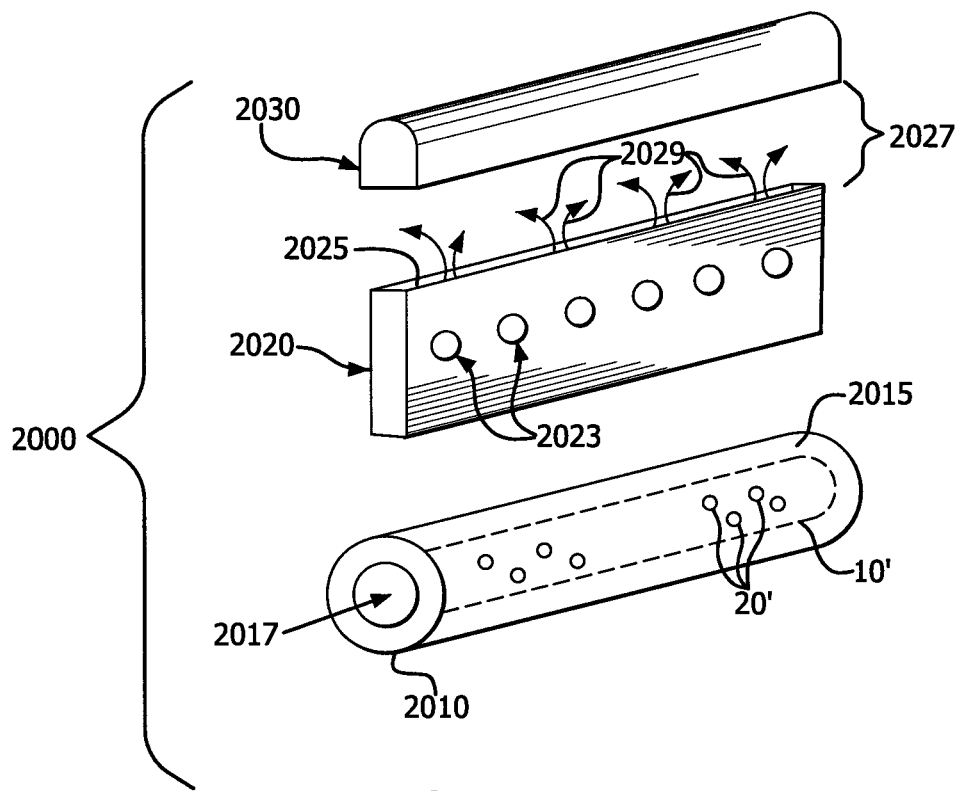

FIGS. 2a, 2a', 2b, 2c, and 2d provide two exploded isometric views, an assembled isometric view, and two exploded side views of the enclosure 2000 comprising a diffuser tube 10' comprising one or more perforations 20' described previously. As described herein, the enclosed diffuser tube can be used as a center diffuser tube, one or more side diffuser tubes, or any combination thereof. Diffuser tube 10' has one or more perforations 20' and is housed within the base 2010 of the enclosure 2000. Base 2010 is in fluid communication with an inerting gas source (not shown) and houses diffuser tube 10' and comprises an interior volume 2015 that allows for the flow of an inerting gas source into the interior volume 2015 and into the diffuser tube 10' as shown by arrow 2017. It is believed that encasing the porous tube within the enclosure can minimize the chance of clogging of diffuser openings by flux and solder. While diffuser tube 10' and its surrounding base 2010 are shown as being cylindrical and having a circular cross-sectional, it is anticipated that other geometries, such as, but not limited to, annular, square, rectangular, elliptical, etc., may be used. Enclosure 2000 further comprises a neck 2020 proximal to base 2010 and interior volume 2025 which is in fluid communication with the interior volume of the base. Enclosure 2000 further comprises a cap 2030 which is proximal to the mouth of neck 2020 which defines an opening 2027 through which the inerting case flows outwardly as shown by arrows 2029. During operation, an inerting gas passes from a source (not shown) into the interior volume 2015 of base 2010, through the diffuser tube 10', out through perforations 20', and into the interior volume 2025 of neck 2020 in the direction shown by arrows 2029 (see FIGS. 2a, 2a', 2c, and 2d). In some embodiments, as shown in FIGS. 2a' and 2d, the neck 2020 of enclosure 2000 may comprise one or more holes 2023 through which solder can pass, thus improving solder flow within the soldering apparatus.

Figure 3A:
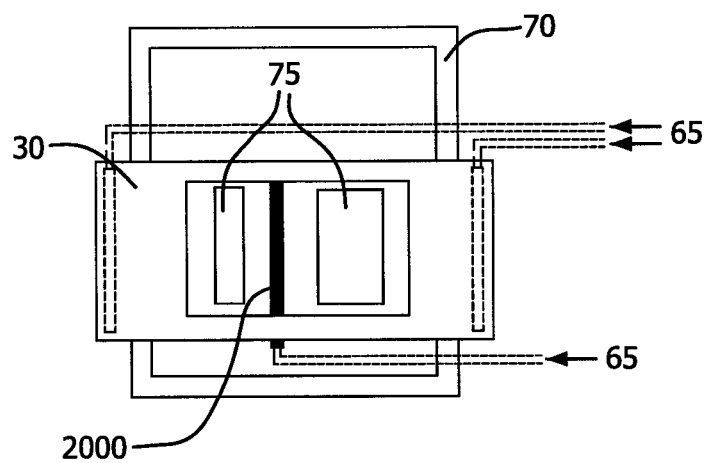
FIG. 3a provides a top view of an embodiment of the enclosure or protective housing, which contains the center diffuser tube enclosed in the bottle neck enclosure with a top cap.
Figure 3B:
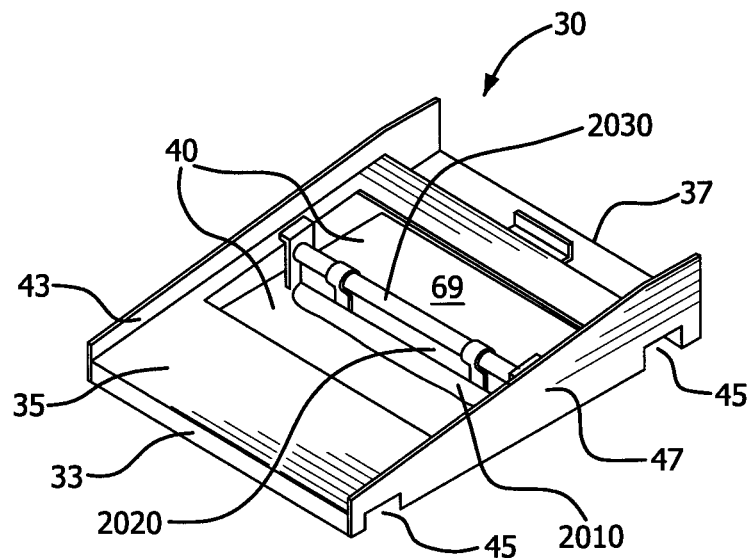
Figure 3C:
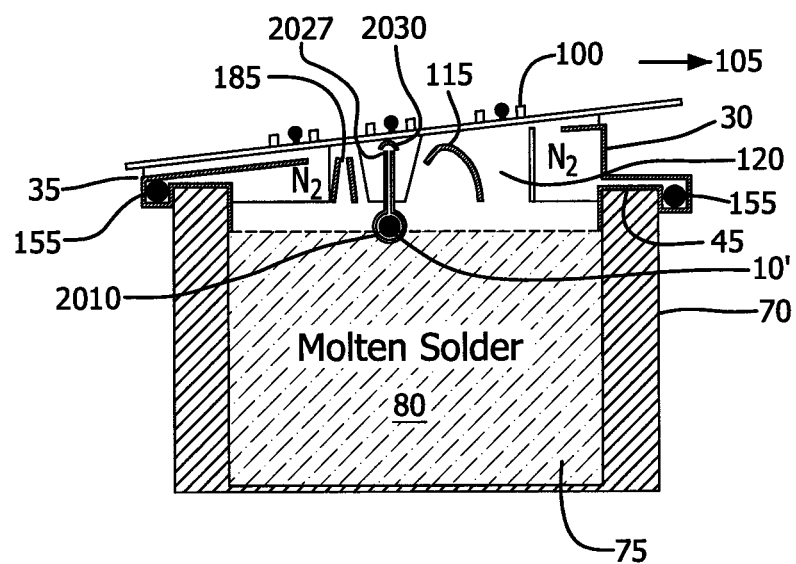
FIG. 3c provides a side view of the embodiment of the apparatus described herein and shown in FIG. 3a wherein the enclosure of the center diffuser is partially immersed into the molten solder.

FIGS. 3a, 3b, and 3c provide a top, isometric, and side view, respectively, of one embodiment of the enclosure described herein. Referring to FIGS. 3a and 3c, apparatus 30 is placed onto wave soldering apparatus 70 to provide an inerting gas atmosphere during a wave soldering operation. Wave soldering apparatus 70 comprises a solder reservoir 75 that contains a molten solder 80, and one or more nozzles 185 that project one or more solder waves (not shown) that are generated by a solder pump (not shown). Referring to FIGS. 3a through 3c, apparatus 30 has a top surface 35 which may be removable from the rest of the apparatus thereby making dross removal relatively easy for the end-user. Top surface 35 further comprises at least one opening 40 through which at least one solder wave emitting from molten solder 80 contained within the solder reservoir 75 passes through nozzles 185 and contacts a work piece that passes through along a moving track (not shown). Referring to FIGS. 3a through 3c, apparatus 30 further comprises at least one groove 45 on the bottom of apparatus 30 that rests atop of an edge of solder reservoir 75. In certain embodiments, apparatus 30 may comprise more than one groove that allow for the placement of apparatus 30 atop of solder reservoir 75 and locate the front and back diffusers 155 out of the solder pot area as shown in FIGS. 3a and 3c. Other embodiments of the apparatus described herein may have only one groove to locate the front diffuser 155 out of the solder pot area. Still further embodiments of the apparatus described herein do not have one or more grooves but rather a plurality of flanges that allow the apparatus to be positioned or placed on solder reservoir and locate all the diffusers inside the solder pot area such as the embodiments depicted in FIGS. 4a and 4b and FIGS. 5a and 5b. Referring again to FIGS. 3a through 3c, the sidewall of grooves 45 and the front wall 33 or back wall 37 define chambers that allow for the placement of porous tubes 10' within apparatus 30. Porous tube 10' is in fluid communication via piping (shown in dotted line in FIG. 3a) to an inerting gas source 65. As previously mentioned, the inerting gas used with the apparatus and method described herein may comprise nitrogen, hydrogen, another inert gas (e.g., helium, argon, neon, krypton, xenon, etc.), or combinations thereof. In certain embodiments, the inerting gas is pre-heated prior to being introduced into porous tubes 10'. It is understood that the embodiment shown in FIGS. 3a through 3c may vary depending upon the configuration of the wave soldering machine.

Referring now to FIGS. 3b and 3c, apparatus 30 further comprises an interior volume 69 defined by the molten solder surface (not shown), the work piece (not shown), front wall 33, back wall 37, and side walls 43 and 47. Apparatus 30 further comprises at least one diffuser tube 10' having a plurality of perforations (not shown) that is housed within an enclosure wherein at least a portion of the base 2010 is immersed within the molten solder reservoir and acts to heat the base 2010 and neck 2020 in the center to a temperature above the melting point of the molten solder.

FIG. 3b provides an isometric view of an embodiment of the apparatus 30 described herein. Referring to FIGS. 3b and 3c, apparatus 30 is placed onto wave soldering apparatus 70 to provide an inerting gas atmosphere during a wave soldering operation. Wave soldering apparatus 70 comprises a solder reservoir 75 that contains a molten solder 80, and one or more nozzles 185 that project one or more solder waves 115 that are generated by a solder pump (not shown). Apparatus 30 has a top surface 35 which may be removable from the rest of the apparatus thereby making dross removal relatively easy for the end-user. Top surface 35 further comprises at least one opening 40 through which at least one solder wave emitting from molten solder 80 contained within the solder reservoir 75 passes through nozzles 185 and contacts a work piece 100 that passes through along a moving track (not shown). In other embodiments, the apparatus described herein may comprise a plurality of flanges (not shown) that allow the apparatus to be positioned or placed on solder reservoir. Porous tubes 10' are in fluid communication via piping to an inerting gas source (not shown). As previously mentioned, the inerting gas used with the apparatus and method described herein may comprise nitrogen, hydrogen, another inert gas (e.g., helium, argon, neon, krypton, xenon, etc.), or combinations thereof. In certain embodiments, the inerting gas is pre-heated prior to being introduced into porous tubes 10'. It is understood that the embodiment shown in FIGS. 3a through 3c may vary depending upon the configuration of the wave soldering machine.

Referring to FIG. 3c, or the side view of an embodiment of the apparatus 30 defined herein, apparatus 30 is placed atop of wave soldering apparatus 70 by placing grooves 45 onto at least one edge of solder reservoir 75 as shown. Solder reservoir 75 has molten solder 80 contained therein. A moving track (not shown) transports work pieces 100 to be soldered in an upward direction indicated in the arrow 105 shown. At least one or more solder pumps (not shown) are used to generate a plurality of solder waves 115 through nozzles 185. The plurality of solder waves 115 contact the underside of work pieces 100 through openings in apparatus 30. An inerting gas introduced into the enclosed porous diffuser tubes is housed in a chamber (not shown) outside of solder reservoir 75. In the embodiment shown in FIG. 3c, diffuser tubes 155 are located at the entrance and exit of the solder reservoir 75. In a still further embodiment, one or more of the diffuser tubes 10' can be oriented perpendicular to the direction of the solder waves (not shown). At least one of the diffuser tubes 10' is housed within an enclosure comprising a base 2010 having an interior volume, a neck 2020 having an interior volume and an opening 2027, and a cap 2030 which is proximal to the opening of the neck 2027. At least a portion of the enclosure such as the base 2010 and neck 2020 are immersed in the solder 80. Inerting gas fills in the area or atmosphere shown as 120 underneath work piece 100 and above the surface of molten solder 80.

Figure 4A:
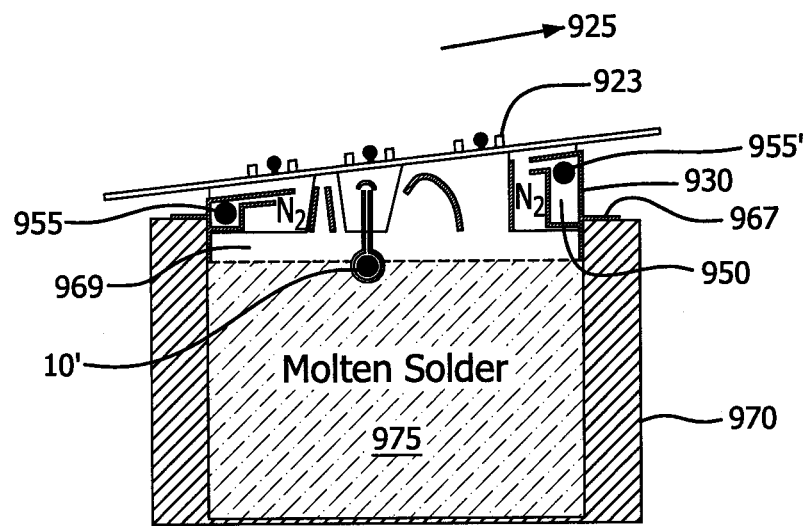
FIG. 4a provides a side view of the embodiment wherein the center diffuser tube is enclosed and at least a portion is immersed onto a solder reservoir.
Figure 4B:
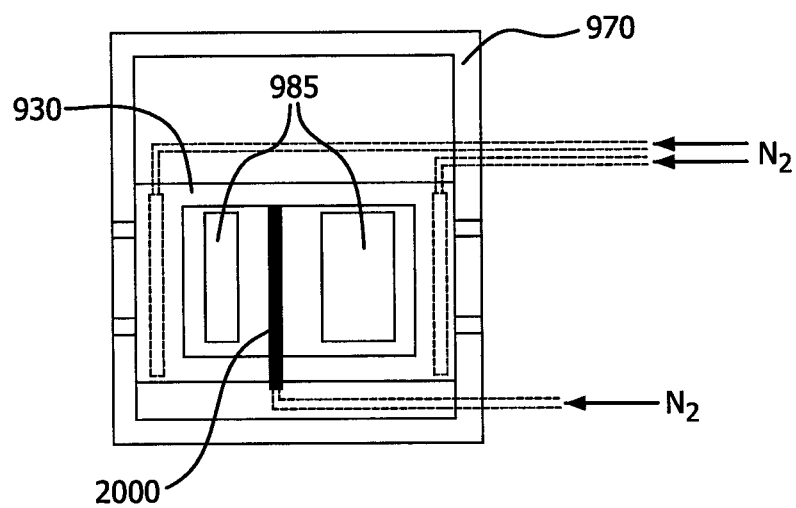

FIGS. 4a and 4b provide the side and top view of an embodiment of the apparatus 930 described herein wherein the first porous tube 955, second porous tube 955', and center diffuser tube 10' are inside the solder reservoir 975, and center diffuser tube 10' is housed within an enclosure wherein at least a portion of the enclosure is immersed within solder reservoir 975. Apparatus 930 does not have grooves to locate the front and back or the first and second diffusers out of the solder reservoir 975 such as those depicted in FIGS. 3a through 3c. Instead, apparatus 930 has a plurality of flanges 967 that allow apparatus 930 to be placed atop solder reservoir 975. Apparatus 930 is shown as being constructed of a double wall of material such as metal which defines at least one chamber 950 that houses at least one of the porous tubes such as 955 and 955' shown. Work piece 923 travels above apparatus 930 in the direction indicated by arrow 925 and is contacted with a plurality of molten solder waves that are emitted from nozzles 985. The plurality of porous tubes are in fluid communication with an inerting gas source such as $N_2$ (not shown) which provides an inerting gas atmosphere or $N_2$ atmosphere through the tubes, into chambers 950, into the volume defined by the double layers of material of 930 and into interior volume 969 defined by the surface of the molten solder in solder reservoir 975, the work piece 923, and the walls of apparatus 930.

Figure 5A:
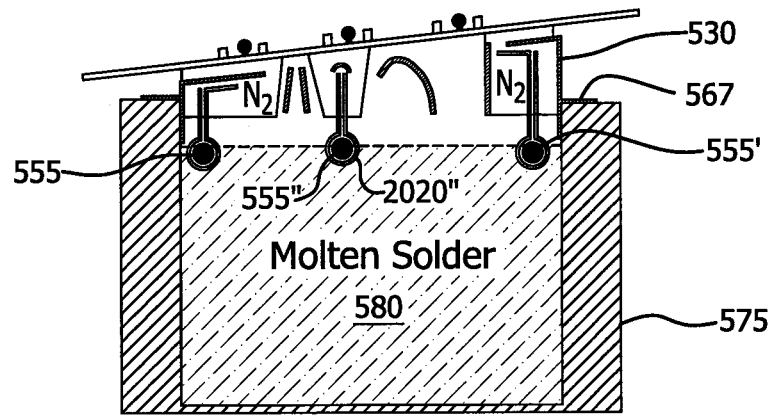
FIG. 5a provides a side view of the embodiment wherein the center diffuser tube and two side diffuser tubes are enclosed and at least a portion is immersed onto a solder reservoir.
Figure 5B:
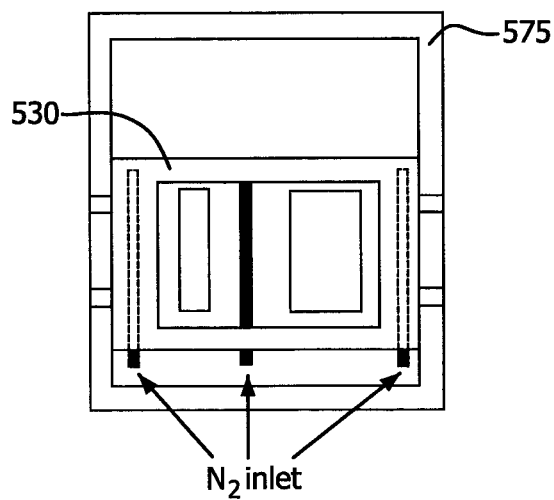

FIGS. 5a and 5b provide the side and top views of an embodiment wherein the first porous tube 555, second porous tube 555', and third porous tube 555" are inside the solder reservoir 575, and each porous tube is enclosed in an enclosure wherein at least a portion of the base of enclosure 2020" is immersed within the molten solder 580 and heats the enclosure to a temperature above the solder's melting point. Apparatus 530 does not have grooves to locate the first and second diffusers out of the solder reservoir area 575. Apparatus 530 has a plurality of flanges 567 that allow apparatus 530 to be placed atop of solder reservoir 575.

Figure 6:
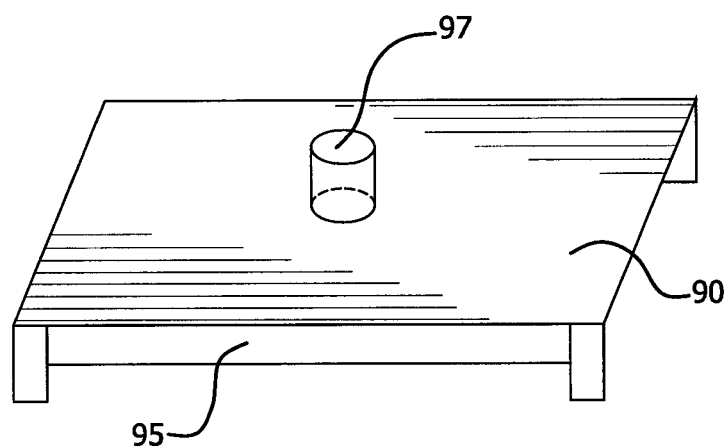
FIG. 6 provides an isometric view of an optional cover that can be used with the apparatus and method described herein.

FIG. 6 provides an isometric view of optional cover 90 that is placed over the apparatus 30 and moving track (not shown) such that the work piece travels therethrough. Optional cover 90 is shown having a glass window 95 that allows for viewing. Optional cover 90 further has a vent 97 that is in fluid communication with the ventilation exhaust (not shown) of the wave soldering machine to remove any flux vapor within the atmosphere of the soldering station.

Figure 7:
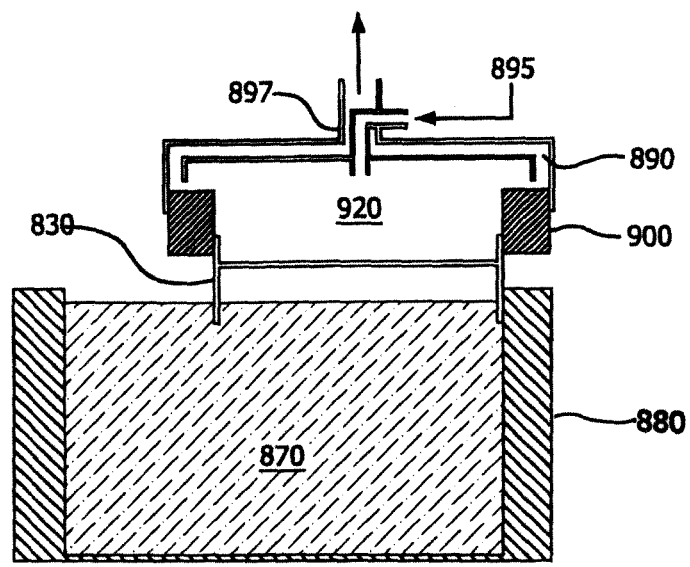
FIG. 7 provides an end view of an optional cover that can be installed on the moving track upon which the work piece travels in the embodiment depicted.

FIG. 7 provides an embodiment of apparatus 830 further comprising an optional cover 890 atop the solder reservoir 880, which contains molten solder 870, thereby forming a tunnel for the work pieces (not shown) held on moving track 900 to pass therethrough. FIG. 7 provides an end view of apparatus 830. In certain embodiments, optional cover 890 is in fluid communication with the ventilation piping of wave soldering machine (not shown) Optional cover 890 is constructed of a double layer of metal sheets or other suitable material, and the double layer space is connected to the furnace ventilation exhaust pipe 897, which forms a boundary gas trap. In certain embodiments, the distance between the two layers of sheets can range from, but is not limited to, ⅛" to ¼". In the embodiments shown in FIG. 7, optional cover 890 may comprise an inerting gas inlet 895 that is in fluid communication with an inerting gas source (not shown) to further assist in purging flux vapor and air out of the soldering area. In certain embodiments, when a circuit board is passing underneath cover 890, flux vapor generated inside the soldering area can be collected through the boundary trap, while air surrounding solder reservoir 880 can also be trapped in the double layer space underneath cover 890, which aids in ensuring a good inerting atmosphere. In instances wherein the solder reservoir 880 is not covered by a work piece, the inerting gas generated by the plurality of porous tubes (not shown) can be sucked in the double layer space of the cover 890 thereby forming a boundary inerting gas curtain to minimize air from entering in from the external environment into the atmosphere 920 above the solder reservoir 880.

While the apparatus and method has been described in detail and with reference to specific examples and the embodiments thereof, it will be apparent to one skilled in the art that various changes and modifications can be made therein without departing from the spirit and scope thereof.

EXAMPLES

Comparative Example 1

Initial Designs of Center Diffuser

Figure 8:
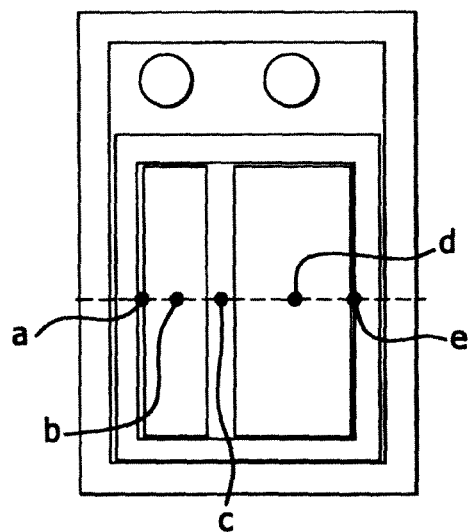
FIG. 8 provides a picture demonstrating the positions that were used to measure $O_2$ concentration in Comparative Example 1.

As shown in FIG. 8, oxygen ($O_2$) concentration measurements around the top space of a solder reservoir without a circuit board loaded above the solder reservoir and without a top cover (such as that shown in FIG. 6) were obtained. Referring to FIG. 8, measurements were taken at the following positions: point a (close to the left edge of a $1^{st}$ solder wave); point b (close to the middle surface of the $1^{st}$ wave); point c (between two solder waves); point d (close to the middle surface of a $2^{nd}$ solder wave); and point e (close to the right edge of the $2^{nd}$ solder wave).

Two different designs for the center diffuser were evaluated based on measuring the oxygen concentrations as shown in Tables 1 and 2. Table 1 is the result related to the first design. In the first design, the center diffuser was enclosed inside a metal protective tube. The protective tube contains multiple rows of open slots to allow inert gas flow and is coated by PTFE coating to provide the non-sticking nature. In Table 2, the center diffuser tube was also enclosed into a slotted and coated protective tube but, rather than having a multiple rows of slots on its surface, the diffuser tube had two longitudinal slots which faced in a downward direction.

TABLE 1

Oxygen concentrations - PTFE coated tube (multiple rows of slots) with internal porous diffuser as the middle diffuser.

| Flow Rate, $m^3$/hr | Oxygen concentration at measuring points, % | | | | |
|---|---|---|---|---|---|
| (left/center/right) | a | b | c | d | e |
| 6/6/6 | 0.25 | 0.62 | 0.22 | 1.36 | 0.50 |
| 6/4/6 | 0.29 | 2.80 | 0.75 | 2.07 | 0.95 |
| 6/4/8 | 0.23 | 2.60 | 0.32 | 1.58 | 1.10 |
| 5/6/6 | 0.32 | 0.72 | 0.20 | 1.53 | 0.50 |
| 5/5/5 | 0.35 | 1.60 | 0.30 | 2.98 | 0.40 |
| 5/6/5 | 0.40 | 1.80 | 0.16 | 2.60 | 0.26 |
| 4/6/4 | 0.58 | 2.40 | 0.17 | 2.40 | 0.17 |
| 4/6/6 | 0.35 | 0.60 | 0.21 | 1.28 | 0.35 |
| 4/6/8 | 0.28 | 1.80 | 0.28 | 1.26 | 0.70 |
| 4/5/6 | 0.37 | 1.20 | 0.27 | 1.56 | 0.75 |
| 4/5/8 | 0.26 | 2.10 | 0.25 | 1.45 | 0.90 |

TABLE 2

Oxygen concentrations - PTFE coated tube (two rows of slots) with internal porous diffuser as the middle diffuser.

| Flow Rate, $m^3$/hr | Oxygen concentration at measuring points, % | | | | |
|---|---|---|---|---|---|
| (left/center/right) | a | b | c | d | e |
| 6/6/6 | 0.43 | 1.35 | 0.60 | 1.20 | 0.19 |
| 6/4/6 | 0.48 | 2.89 | 0.80 | 0.50 | 0.20 |
| 6/4/8 | 0.70 | 2.30 | 0.76 | 0.65 | 0.18 |
| 5/6/6 | 0.38 | 1.14 | 0.45 | 1.08 | 0.26 |
| 5/5/5 | 0.55 | 1.81 | 0.42 | 0.80 | 0.18 |
| 5/6/5 | 0.38 | 1.28 | 0.50 | 0.75 | 0.19 |
| 4/6/4 | 0.27 | 1.90 | 0.46 | 1.15 | 0.20 |
| 4/6/6 | 0.31 | 1.08 | 0.67 | 1.32 | 0.25 |
| 4/6/8 | 0.41 | 1.20 | 0.73 | 1.15 | 0.22 |
| 4/5/6 | 0.43 | 1.15 | 0.75 | 1.40 | 0.24 |
| 4/5/8 | 0.42 | 1.51 | 0.93 | 1.30 | 0.20 |

In Tables 1 and 2 above, the flow rate is provided in cubic meters per hour ($m^3$/hr) and the three flow rate readings are for the left/center/right or front/center/back diffusers. The measured oxygen concentrations are expressed as a percentage. During the oxygen measurements, the solder reservoir temperature was maintained at 260° C. with two solder waves generated and ventilation fully open. As indicated in Tables 1 and 2, the oxygen concentrations for both cases were significantly above the targeted level of 2000 ppm or 0.2%. The reason for these high oxygen readings is that the space between the two waves was too tight, such that the center diffuser's location could not be optimized. A short time flux testing (1 to 2 hours) was conducted. It was found that the PTFE coated protective tube was effective for reducing contamination by flux and solder, but it could not completely eliminate contamination because the protective tube was not heated.

Example 2

Inventive Center Diffuser Design

Figure 2B:
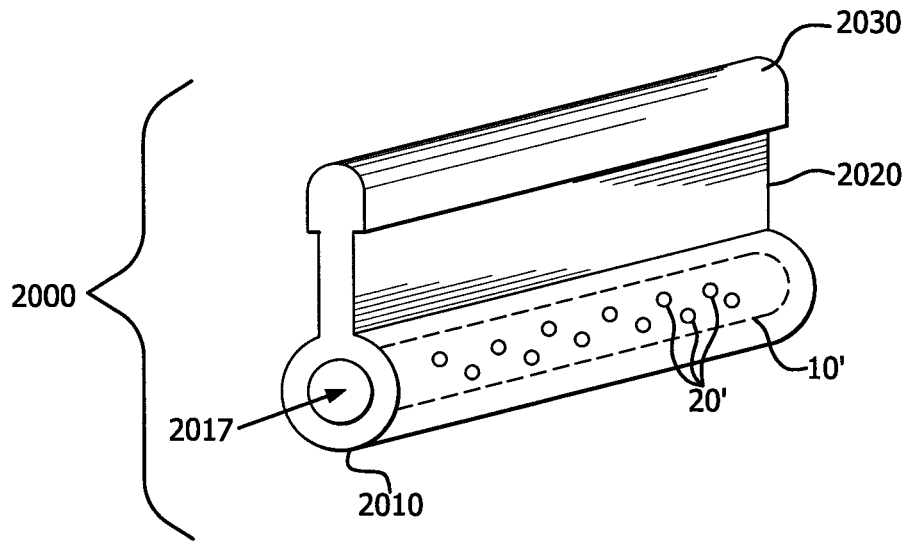
Figure 2C:
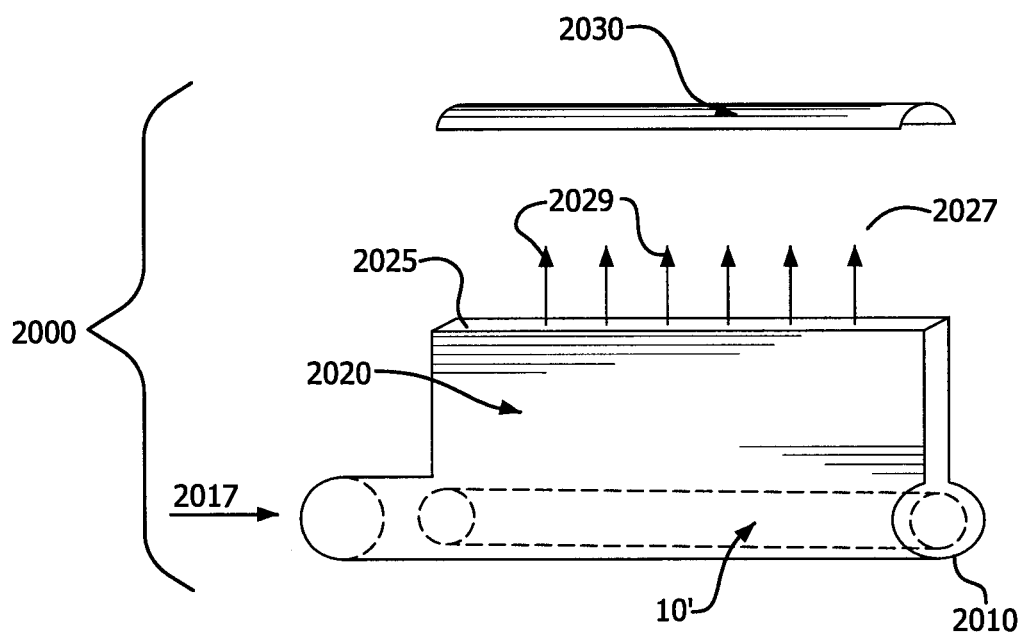
Figure 2D:
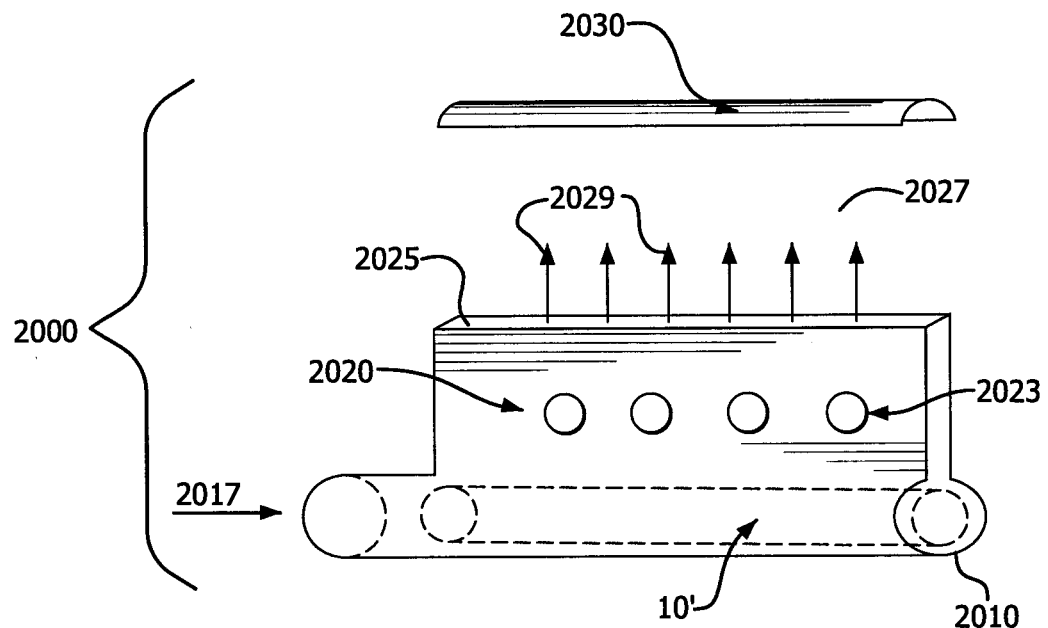
FIG. 2d provides a side, exploded view of an embodiment shown in FIG. 2a'.
Figure 9:
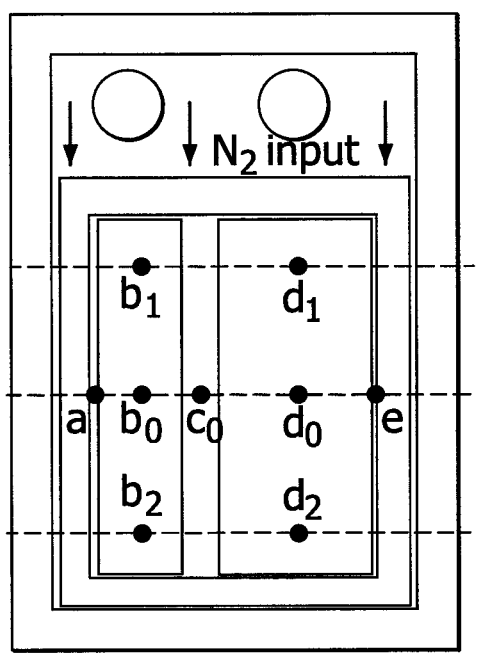
FIG. 9 provides a picture demonstrating the positions that were used to measure $O_2$ concentration in Example 2.

The present example demonstrates the results for housing the center diffuser tube in an enclosure according to the invention, similar to that depicted in FIGS. 2a through 2c and designed to reduce oxygen concentration and prevent diffuser clogging. In the present experiment, the center porous tube was housed within an enclosure and located between two solder waves. It is believed that this arrangement can avoid clogging problems such as by solidification of solder splash and condensation of flux vapor on diffuser surface. As in Example 1, the oxygen concentration measurements were conducted without a work piece or cover over the solder reservoir. $O_2$ concentrations at nine positions around the solder reservoir were measured at different $N_2$ flow arrangements in the positions designated in FIG. 9. In Example 2, positions $b_0$ and $d_0$ in FIG. 9 are comparable to positions b and d in FIG. 8. During the $O_2$ measurements, the solder reservoir temperature was maintained at 260° C. with two solder waves generated and the ventilation through the furnace pipe line fully open. The flow rate is provided in cubic meter per hour ($m^3$/hr) and the three flow rate readings are for the left/center/right or front/center/back diffusers. The measured data are oxygen concentrations expressed as a percentage. As shown in Table 3, in most cases, the oxygen concentrations were below the targeted level, e.g., 2000 ppm or 0.2%. In addition, based on a two-day test using flux, there was no observed diffuser clogging. The results for the oxygen concentration measurements are provided in the following Table 3.

TABLE 3

| Flow Rate, m³/hr (left/ center/ right) | a | b $b_1$ | $b_0$ | $b_2$ | c | d $d_1$ | $d_0$ | $d_2$ | e |
|---|---|---|---|---|---|---|---|---|---|
| 6/6/6 | 0.18 | 0.19 | 0.20 | 0.23 | 0.16 | 0.19 | 0.20 | 0.23 | 0.18 |
| 4/6/6 | 0.16 | 0.43 | 0.21 | 0.17 | 0.21 | 0.25 | 0.23 | 0.21 | 0.16 |
| 4/6/8 | 0.16 | 0.62 | 0.45 | 0.16 | 0.24 | 0.41 | 0.42 | 0.20 | 0.16 |
| 4/5/6 | 0.16 | 0.48 | 0.28 | 0.16 | 0.21 | 0.62 | 0.24 | 0.21 | 0.16 |
| 4/5/8 | 0.17 | 0.59 | 1.43 | 0.17 | 0.22 | 1.1 | 0.47 | 0.20 | 0.17 |
| 6/4/6 | 0.16 | 0.17 | 0.21 | 0.49 | 0.16 | 0.20 | 0.21 | 0.20 | 0.16 |
| 6/4/8 | 0.17 | 0.27 | 0.40 | 0.16 | 0.17 | 0.29 | 0.24 | 0.18 | 0.17 |
| 5/6/6 | 0.16 | 0.29 | 0.24 | 0.18 | 0.16 | 0.20 | 0.19 | 0.18 | 0.17 |
| 5/5/5 | 0.19 | 0.19 | 0.18 | 0.40 | 0.16 | 0.29 | 0.20 | 0.20 | 0.18 |
| 5/6/5 | 0.17 | 0.25 | 0.17 | 0.31 | 0.16 | 0.24 | 0.21 | 0.20 | 0.16 |
| 4/6/4 | 0.17 | 0.47 | 0.18 | 0.29 | 0.17 | 0.30 | 0.19 | 0.22 | 0.17 |
| 4/4/4 | 0.22 | 1.16 | 0.46 | 1.21 | 0.17 | 0.44 | 0.40 | 0.22 | 0.23 |
| 4/5/4 | 0.22 | 1.27 | 0.32 | 0.43 | 0.18 | 0.38 | 0.24 | 0.20 | 0.22 |

Example 3

Inventive Center Diffuser Design with Holes in Neck of Enclosure

Oxygen concentrations were also measured for center diffuser designs having holes along the neck of the enclosure, similar to those depicted in FIGS. 2a' and 2d. Results were measured with a top cover and both with and without a work piece. Oxygen concentrations were in the desired range of approximately 2000 ppm (0.20%) without a work piece loaded, and were approximately 500-600 ppm (0.05-0.06%) with a work piece. Additionally, good solder flow around the center diffuser was observed.

Example 4

Dross Formation—Inventive Center Diffuser Design

The present example demonstrates reduction in dross formation as a result of housing the center diffuser tube in an enclosure according to the invention. The apparatus was run at nitrogen flow rates of 6 m³/hr in the left, center, and right diffuser tubes and at a nitrogen pressure of 4.0 bar. Dross formation was determined by measuring the amount of dross collected each day (with a running time of 6 hours) with and without a work piece and with and without a cover over the solder reservoir. The work piece employed was a board having dimensions of 350 mm by 450 mm. The dross collection results are reported below in Table 4, and compared against a baseline in which no apparatus was employed to provide inerting gas. As shown in Table 4, dross formation was significantly reduced in most cases.

TABLE 4

| Operating Conditions | | | | Dross Collection, kg | | | Reduction in Dross Formation, % |
|---|---|---|---|---|---|---|---|
| Inerting Apparatus | Top Cover | Work Piece | Middle Diffuser | Day 1 | Day 2 | Average | |
| no | no | no | no | 8.6 | 8.1 | 8.35 | baseline |
| no | no | yes | no | 7.6 | — | 7.6 | |
| yes | no | no | yes | 1.3 | 1.2 | 1.25 | −83.6% |
| yes | yes | no | yes | 0.85 | 0.90 | 0.88 | −88.4% |
| yes | no | yes | yes | 0.25 | — | 0.25 | −96.7% |
| yes | yes | yes | yes | 0.15 | 0.10 | 0.13 | −98.4% |
| yes | no | no | yes* | 2.4 | — | 2.4 | −68.4% |
| yes | yes | no | yes* | — | — | — | N/A |
| yes | no | yes | yes* | 0.95 | — | 0.95 | −87.4% |
| yes | yes | yes | yes* | 0.60 | — | 0.60 | −92.1% |

*Diffuser clogged and was removed for at least part of testing

Further benefits of apparatuses and methods according to the present invention include reduction in manufacturing and material costs, improved solder joint quality, and simplified transition to lead-free soldering technology. With regard to manufacturing and material costs, reductions of 20-40% in solder consumption, 40-90% in dross formation, 10-30% in flux consumption, and 70-80% in equipment maintenance have been observed, along with lower costs for post assembly board cleaning, reduced board defects and reworking, and higher productivity uptime. A further benefit of the apparatuses disclosed herein is that they can easily be scaled up or down and can be configured to fit solder pots having a variety of different dimensions. In particular, the neck of the enclosures described herein is small enough to fit in very narrow spaces between two solder waves, and the overall diffuser enclosure design may be adjusted horizontally, vertically, or in both dimensions to fit a desired application.

Various terms have been defined above. To the extent a term used in a claim is not defined above, it should be given the broadest definition persons in the pertinent art have given that term as reflected in at least one printed publication or issued patent. Furthermore, all patents, test procedures, and other documents cited in this application are fully incorporated by reference to the extent such disclosure is not inconsistent with this application for all jurisdictions in which such incorporation is permitted.

Certain embodiments and features of the invention have been described using a set of numerical upper limits and a set of numerical lower limits. For the sake of brevity, only certain ranges are explicitly disclosed herein. However, it should be appreciated that ranges from any lower limit to any upper limit are contemplated unless otherwise indicated. Similarly, ranges from any lower limit may be combined with any other lower limit to recite a range not explicitly recited, and ranges from any upper limit may be combined with any other upper limit to recite a range not explicitly recited. Further, a range includes every point or individual value between its end points even though not explicitly recited. Thus, every point or individual value may serve as its own lower or upper limit combined with any other point or individual value or any other lower or upper limit, to recite a range not explicitly recited. All numerical values are "about" or "approximately" the indicated value, and take into account experimental error and variations that would be expected by a person having ordinary skill in the art.

While the foregoing is directed to embodiments of the invention and alternate embodiments thereof, various changes, modifications, and alterations from the invention may be contemplated by those skilled in the art without departing from the intended spirit and scope thereof. It is intended that the present invention only be limited by the terms of the appended claims.

The invention claimed is:

1. A method for providing an inerting gas atmosphere during wave soldering of a work piece, the method comprising:
   providing a wave soldering machine comprising: a solder reservoir having molten solder contained therein, at least one nozzle, and at least one pump to generate at least one solder wave from the molten solder bath upwardly through the nozzle;
   placing an apparatus atop at least one edge of the solder reservoir wherein the apparatus comprises at least one opening on a top surface, at least one groove that rests atop the at least one edge of the solder reservoir, and at least one tube comprising one or more openings in fluid communication with an inerting gas source, wherein the work piece and the top surface of the molten solder define an area that contains an atmosphere;
   passing the work piece along a path so that at least a portion of the work piece contacts the at least one solder wave emitting through the opening of the apparatus; and
   introducing an inerting gas through the at least one tube into the atmosphere, wherein the at least one tube resides in an enclosure;
   wherein the enclosure comprises a base comprising an interior volume in fluid communication with an inerting gas source, a neck comprising an interior volume and an neck opening in fluid communication with the base, and a cap proximal to the neck opening, wherein the at least one tube residing in the enclosure is housed within the base;
   wherein the inerting gas travels through the at least one tube into the interior volume of the base, through the neck and is directed into the atmosphere by the cap;
   wherein the neck has a top surface;
   wherein the cap has a bottom surface; and
   wherein the bottom surface is facing the top surface and the bottom surface has a larger surface area than the top surface.

2. The method of claim 1 wherein at least a portion of the enclosure, the neck, the cap, or a combination thereof comprise a non-stick coating or material.

3. The method of claim 1 wherein the at least one tube resides proximal to the at least one solder wave.

4. The method of claim 1 further comprising a cover that transports the work piece across the apparatus, wherein the cover further comprises a vent which is in fluid communication with a ventilation system.

5. The method of claim 4 wherein the cover comprises a plurality of sheets that define an interior volume and wherein the interior volume is in fluid communication with the ventilation exhaust of a soldering furnace.

6. The method of claim 5 wherein the cover further comprises an inlet in fluid communication with an inerting gas source.

7. The method of claim 1 wherein the one or more tubes comprise pores and wherein the average pore size is 0.2 µm or less.

8. The method of claim 1 wherein the apparatus comprises one or more grooves wherein the grooves help to define one or more chambers in which one or more of the tubes reside.

9. The method of claim 1 wherein the solder reservoir generates a plurality of solder waves and wherein the at least one tube residing in the enclosure is interposed between the solder waves.

10. The method of claim 1 wherein the inerting gas comprises nitrogen.

11. The method of claim 10 wherein the inerting gas further comprises 5% by weight or less of hydrogen.

12. The method of claim 1 wherein the inerting gas comprises a gas selected from the group consisting of nitrogen, hydrogen, helium, neon, argon, krypton, xenon, and combinations thereof.

13. The method of claim 1, wherein the neck further comprises one or more holes along its surface.

* * * * *